United States Patent [19]

Branch

[11] 3,932,811

[45] Jan. 13, 1976

[54] METHOD AND APPARATUS FOR TESTING WINDINGS OR THE LIKE

[75] Inventor: Robert L. Branch, Brecksville, Ohio

[73] Assignee: Avtron Manufacturing, Inc., Cleveland, Ohio

[22] Filed: Feb. 22, 1972

[21] Appl. No.: 228,184

[52] U.S. Cl............ 324/158 MG; 29/596; 324/83 A
[51] Int. Cl.² ................... G01R 31/06; H02K 15/00
[58] Field of Search ........ 324/158 MG, 55, 158 SY, 324/83 A; 29/593, 596; 318/490; 322/99

[56] References Cited
UNITED STATES PATENTS

| | | | |
|---|---|---|---|
| 2,600,088 | 6/1952 | Ward............................ | 324/158 MG |
| 2,609,435 | 9/1952 | Gerth........................... | 324/158 SY |
| 2,752,568 | 6/1956 | Ward............................ | 324/158 MG |
| 2,890,407 | 6/1959 | Huehn et al. .................. | 324/51 |
| 3,231,817 | 1/1966 | Bailey........................... | 324/158 MG |

FOREIGN PATENTS OR APPLICATIONS 1,903,410  10/1970  Germany..................... 324/158 MG

OTHER PUBLICATIONS

Gildersleeve, N.; "Nine Performance Tests . . ."; General Electric Review; August 1945; pp. 52–56.

*Primary Examiner*—Alfred E. Smith
*Assistant Examiner*—Ernest F. Karlsen

[57] ABSTRACT

Apparatus and method for testing windings, as for determining proper winding connections, by sensing the magnetic fields produced at the windings when energized by a time varying signal. Output signals are produced in dependence upon the polarity or direction of the magnetic fields. These signals are compared with a clock signal synchronized to the energizing signal to obtain an indication as to the phase relationship of the magnetic fields.

21 Claims, 5 Drawing Figures

METHOD AND APPARATUS FOR TESTING WINDINGS OR THE LIKE

This invention relates to the art of electrical testing and, more particularly, to testing windings or the like by sensing the magnetic field produced at a winding and determining the phase relationship of the magnetic field relative to that of an applied magnetic field producing signal, or to the magnetic field produced at a second winding.

The invention is particularly applicable for use in testing motor windings, such as the winding connections of a single or multi-phase A.C. motor, for determining whether the windings are properly connected for obtaining a given motor rotation; although, the invention has broader applications and may be used in various testing applications where, for example, it is desired to obtain knowledge of the phase relationship between the magnetic field produced at a given winding relative to an energizing signal, or to the magnetic field produced at a second winding.

One of the sources of error in the manufacture of an electrical motor is an incorrect connection between the windings. For example, if the termination between the start winding and the main winding of a single phase, fractional horsepower motor is not correct, the motor will run in the wrong direction. Consequently, it is desirable to conduct a test prior to final assembly of a motor to determine if the windings have been properly connected. One test which has been employed in the prior art is to insert a dummy rotor into the bore of the motor and then energize both the start and main windings. The dummy rotor will then rotate in the direction of the rotating field, thereby providing an indication as to the accuracy of the winding connections. However, this test procedure requires very close mechanical tolerances. Unless the air gap is held very close to the actual motor air gap the test may be defective.

Another test employed in the prior art for testing windings of a motor has included the application of a D.C. voltage to the stator windings. A magnetic compass is then positioned so as to determine the polarity of each adjacent pole. The motor will rotate in the direction of similar polarities of adjacent poles. This is a very time consuming and expensive process since the test must be performed manually and the operator must accurately interpret the test results.

The present invention is directed toward apparatus and method for testing windings, or the like, by which a determination of proper winding direction may be obtained from the phase relationship between a magnetic field produced at a winding, and the signal causing the magnetic field or with the magnetic field produced at a second winding. As applied to testing motor windings, the invention obtains a determination as to whether the windings have been properly connected for a given motor rotation without the requirement of a dummy rotor or magnetic compass and the like.

It is therefore an object of the present invention to provide an improved apparatus and method for testing motor windings and the like for proper winding connections to obtain desired motor rotation without the use of dummy rotors or magnetic compasses and the like.

It is a still further object of the present invention to provide apparatus and method for testing motor windings and the like to provide a GO or NO GO type indication as to whether the windings have been properly or improperly connected to obtain the results desired.

It is a still further object of the present invention to test magnetically coupled windings for desired electrical relationships by sensing the phase relationship between the magnetic fields produced at the windings in response to electrical energy applied thereto.

It is a still further object of the present invention to test for anticipated electrical characteristics of a winding or the like by applying thereto a time varying electrical signal and then sensing the magnetic field produced and determining whether phase relationship between that magnetic field and the time varying signal is as expected.

It is a still further object of the present invention to test for desired electrical characteristics of a pair of magnetically coupled windings by applying a time varying electrical signal to the windings and then determining the phase relationship of the magnetic fields produced at the windings.

In accordance with one aspect of the present invention, apparatus and method are provided for testing electrical characteristics of a winding in dependence upon a determination as to the phase relationship of the magnetic field produced with respect to an applied magnetic field producing signal. In this context, a time varying electrical input signal is applied to the winding so as to produce a varying magnetic field. An output signal is developed from the magnetic field, as with a sensing coil, so that the output signal varies in magnitude and direction with that of the field. A pair of control signals are developed, with one of the signals being substantially in phase with the output signal and the other signal displaced in phase by substantially 180° with respect to the output signal. The phase relationship of each of these two signals is determined relative to a third signal, which is substantially in phase with the input signal, for purposes of providing an output indication as to the phase relationship between the magnetic field producing input signal and the sensed output signal obtained from the magnetic field.

In accordance with another aspect of the present invention, apparatus and method are provided for testing first and second windings for determining the relative phase relationship of the magnetic fields produced at the respective windings when they are energized by application of voltage thereto to obtain first and second magnetic fields. The two magnetic fields are sensed so as to provide first and second output signals which are respectively representative of the phases of the two magnetic fields. These two output signals are then compared for purposes of providing an output indication indicative of the phase relationship of the windings in dependence upon the phase relationship of the first and second output signals.

The foregoing and other objects and advantages of the invention will become more readily apparent from the following description of the preferred embodiment of the invention as taken in conjunction with the accompanying drawings which are a part hereof and wherein:

Figure 1:
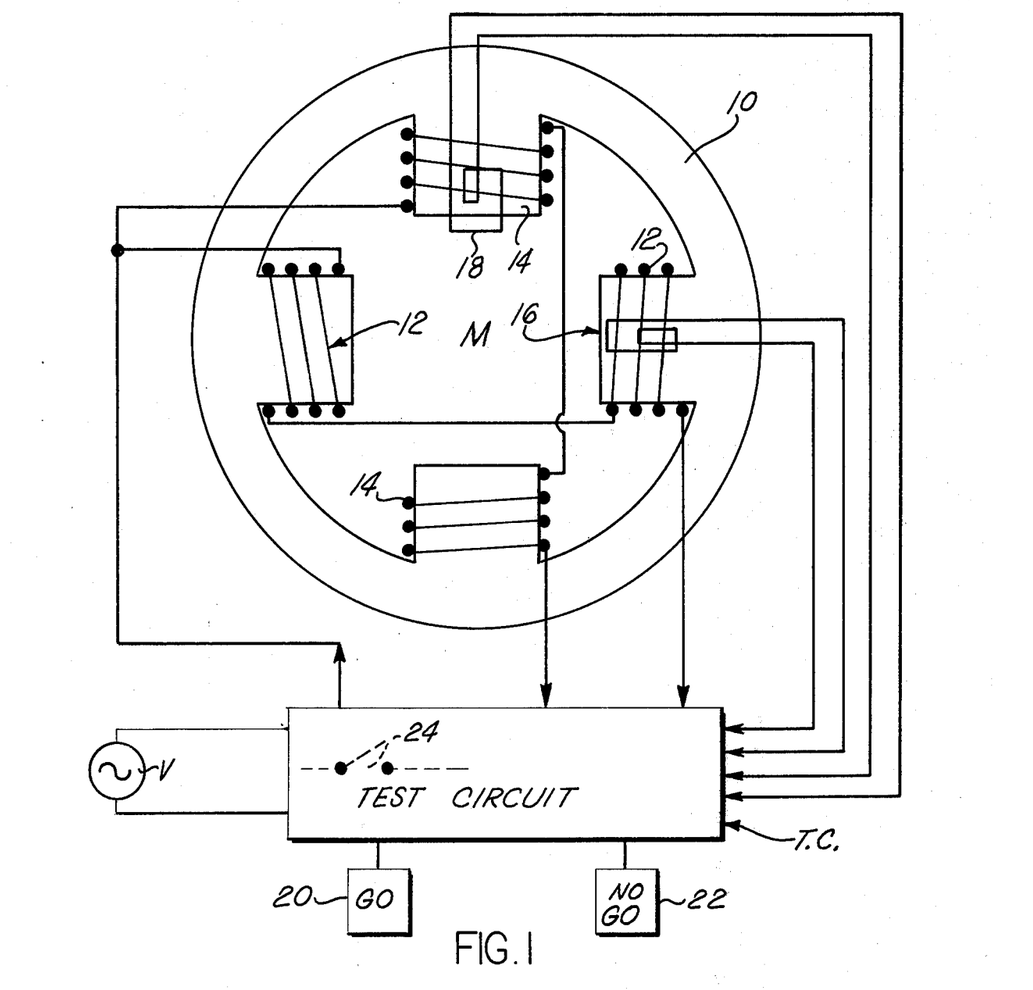
FIG. 1 is a schematic illustration of one application of the invention in context with determining proper winding connections of both the main winding and the start winding on the stator of a fractional horsepower motor.
Figure 2:
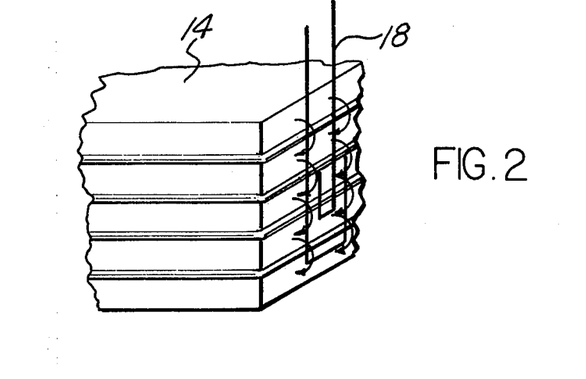
FIG. 2 is a fragmentary perspective view illustrating the positioning of a sensing coil with respect to the magnetic field produced at a winding on the stator shown in FIG. 1.

Referring now to the drawings wherein the showings are for purposes of illustrating a preferred embodiment of the invention and not for purposes of limiting same, there is shown in FIGS. 1 and 2 one application of the invention as applied to testing the stator windings of a fractional horsepower motor. FIGS. 1 and 2 present a simplified illustration of a stator 10 of a fractional horsepower motor. Stator 10 is illustrated as having four poles, with main windings 12 being disposed on diametrically opposed stator poles and start windings 14 as being disposed on a second pair of diametrically opposed stator poles. As is well known, once the motor assembly has been completed, the direction of motor rotation will be dependent upon the direction in which windings 12 and 14 have been wound on their respective poles. It is desirable in the manufacture of such a motor that an indication be obtained as to the accuracy of the winding connections prior to final assembly.

The present invention recognizes that in a motor stator some of the magnetic field produced will not be contained within the stator, but will be external and have a fringing effect. Thus by "Lenz's" law, as the field is collapsing and expanding an alternating voltage may be produced in an adjacent conductor. Consequently, if a sensing coil be positioned within the magnetic field the induced voltage will either be in phase or out of phase, with the exciting voltage, depending on the direction of the stator windings.

Briefly, in accordance with the present invention, a test circuit TC is employed for purposes of applying a test signal to the stator windings to produce time varying magnetic fields. Sensing coils 16 and 18 are respectively positioned adjacent to the end turns of the main and start windings and located within the magnetic fields produced, as is shown in FIG. 2 with respect to sensing coil 18. Voltages are induced in the sensing coils and they exhibit a phase relationship dependent upon the phase relationship of the respective magnetic fields and, hence, dependent upon the winding connections. As will be developed in greater detail hereinafter, the test circuit TC may be selectively programmed to recognize a particular phase relationship of these induced voltages as being in an accept condition or a reject condition, depending on the results desired. If an accept condition is determined, then the test circuit actuates a GO indicator 20. Conversely, if a reject condition is determined, then the test circuit serves to actuate a NO GO indicator 22. Consequently, a relatively unskilled operator may be employed to conduct a winding test. Once the sensing coils are positioned in the magnetic fields, preferably adjacent to the end turns of the main winding and the start winding, the operator need only actuate a simple pushbutton 24 and then observe whether a GO indication is presented or a NO GO indication is presented.

The description presented herein is with respect to the test circuit TC applying an alternating voltage to the main and start windings from an alternating current voltage source V. This is necessary in order to obtain magnetic fields which expand and collapse so that voltages may be induced in the sensing coils. It is contemplated that a D.C. test signal may be applied if it is a transient signal. In either case, a time varying signal is used and, hence, a time varying magnetic field is developed which can be sensed by a sensing coil.

The application of the invention to be described herein is with respect to testing main and start stator windings of a single phase fractional horsepower motor. The invention may also be used for testing the winding connections of a multi-phase motor, such as 3 phase, 6 phase or 12 phase. It is to be appreciated that the test may be made with respect to various types of magnetically coupled windings other than the windings of a motor. Also, the windings to be tested need not be magnetically coupled. For example, the test circuit may be employed for determining whether or not a polarized relay is properly wound by comparing the magnetic field developed at the relay winding with a known reference winding to determine the phase relationship of the magnetic fields and, hence, whether the polarized relay has its winding properly connected.

In the description which follows, the main windings and start windings are energized at different points in time and the magnetic fields produced are sensed at different points in time. These time spaced tests are conducted since if the start and main windings are in close prosimity, and if both windings are energized simultaneously, overlapping fields will result. However, if the fields are sufficiently spaced apart, then the tests may be conducted simultaneously. Also, if the sensing coils are positioned in close proximity to the end turns, then the magnetic fields may not overlap to the point that they are both sensed by each of the sensing coils.

Figure 3:
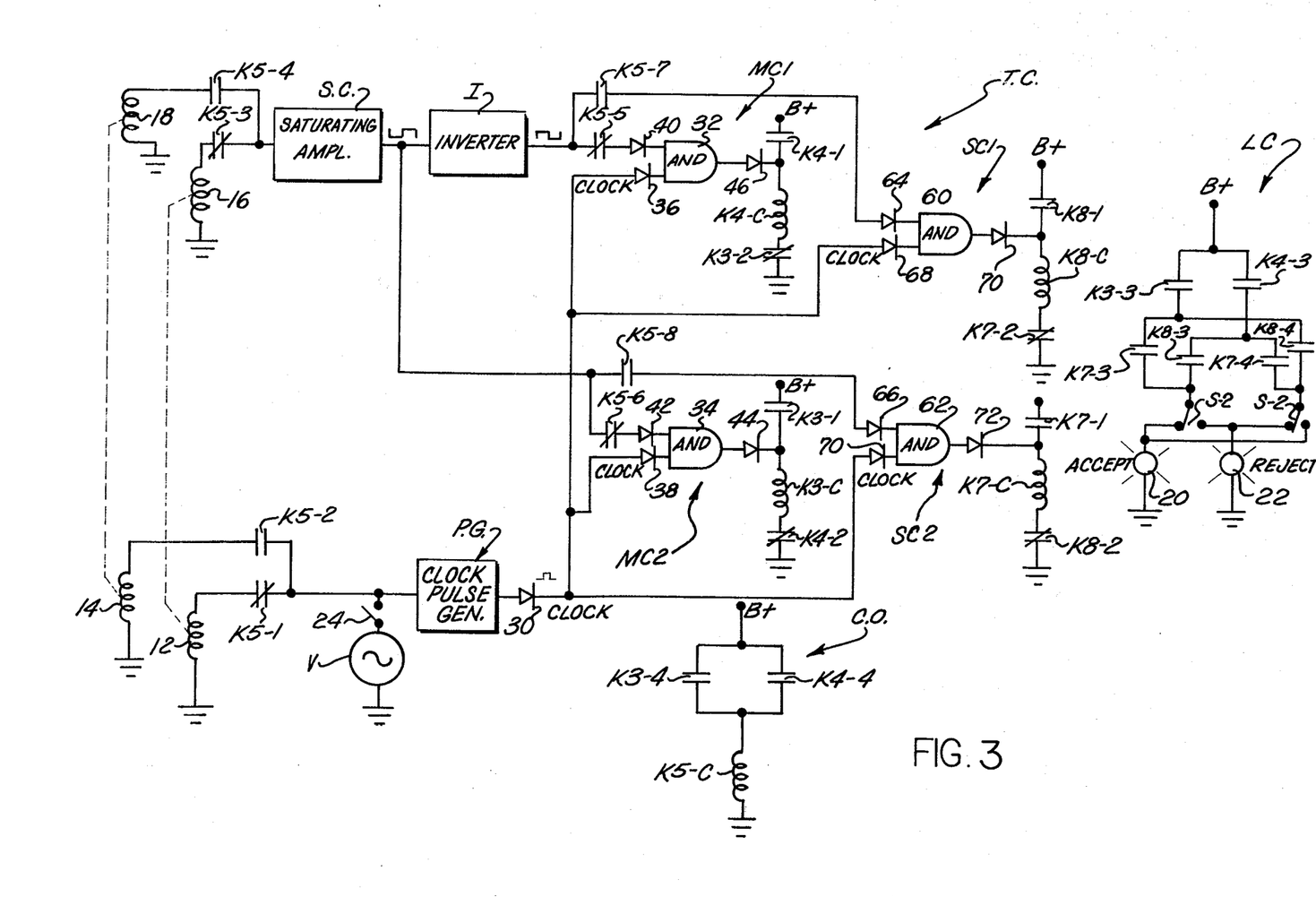
FIG. 3 is a simplified schematic-block diagram illustration of one embodiment of the testing apparatus employed in the present invention; and, FIG. 4 is a more detailed schematic-block diagram illustration of the preferred testing apparatus employed in the present invention.

Reference is now made to the simplified schematic-block diagram illustration of the test circuit TC as shown in FIG. 3. It will be assumed that an acceptable test is one in which the magnetic fields in the main winding and the start winding are in phase. If the test circuit determines this phase relationship is present, then the accept or GO indicator 20 will be energized. The test is divided into two parts, with the first part being conducted by energizing main winding 12 and comparing the induced voltage in the sensing winding 16 with a clock signal synchronized to the energizing voltage source. Depending upon whether these signals are in phase or out of phase, one of two relay coils is energized. The start winding is then energized in the same fashion and the induced voltage in the sensing winding 18 is compared with another clock signal synchronized to the energizing voltage source, and one of two other relay coils is energized depending on whether the signals are in phase or out of phase. Thus, during each test portion one of two relay coils is energized. Depending on which combination of two relay coils has been energized, either the accept or GO indicator 20 is energized or the reject or NO GO indicator 22 is energized.

Referring more specifically to the operation which ensues, a test procedure is commenced upon closure of switch 24 to apply an alternating voltage to energize main winding 12 from source V through a set of normally closed relay contacts K5-1. The magnetic field produced by energization of winding 12 is sensed by coil 16 since a voltage signal will be induced in the sensing coil dependent upon the polarity or direction of the magnetic field. This signal is applied through another set of normally closed relay contacts K5-3 to a saturating amplifier which serves as a squaring circuit SC to obtain a substantially square wave output signal from the somewhat distorted sinusodial signal induced in winding 16. The square wave signal is then inverted by an inverter amplifier I so as to obtain a square wave signal which is displaced in phase by 180° from that provided by squaring circuit SC. The inverted square wave output provided by the inverter amplifier I is applied to a main winding comparator circuit MC1 through normally closed relay contacts K5-5, and the square wave signal obtained from the output of the squaring circuit SC is applied to a second main winding comparator circuit MC2 through normally closed relay contacts K5-6. These comparing circuits serve to compare the phase displaced square wave signals with a synchronizing signal, and provide an output indication as to which square wave signal is in phase with the synchronizing signal.

The synchronizing signal is obtained from a pulse generator PG connected to the energizing alternating voltage source V and serves to provide clock pulses synchronized to the positive half cycle of the alternating voltage source. Clock pulses obtained from the pulse generator PG are applied through a diode 30 and then to one input each of AND gates 32 and 34 in the respective comparator circuits MC1 and MC2 by way of diodes 36 and 38, respectively. Thus, AND gates 32 and 34 are clock enabled gates and each serves to provide a positive output signal only if the second input of the AND gate receives a positive signal during the period that the gate is enabled by a clock pulse. The square wave outputs from the inverter circuit I and the squaring circuit SC have their negative portions removed by diodes 40 and 42 so that positive signals are applied to AND gates 32 and 34. However, the positive signal applied to AND gate 32 from the inverter circuit I is 180° out of phase with respect to that applied to AND gate 34 from the squaring circuit SC. Consequently, if we assume that the voltage induced in sensing coil 16 is in phase with the alternating current voltage source, then at the point in time that AND gates 32 and 34 are enabled only AND gate 34 will provide a positive output signal. This signal is applied through a diode 44 to energize relay coil K3-C through normally closed relay contacts K4-2. Relay coil K3-C will now lock-up through a holding circuit including the now closed, normally open set of relay contacts K3-1 to a B+ voltage supply. Had the voltage induced in the sensing coil 16 been out of phase with voltage source V, then during the time that AND gates 32 and 34 are enabled, only AND gate 32 would have provided a positive output signal. In such case, the positive output signal would have been applied through a diode 46 to energize relay coil K4-C through a set of normally closed relay contacts K3-2. When relay coil K4 is thus energized it locks-up through its own holding circuit including a set of now closed, but normally opened, relay contacts K4-1 connected to a B+ voltage supply source.

In the example given, only one of the relay coils K3 or K4 is energized in response to a comparison function. If relay coil K3 becomes energized then its normally closed contacts K3-2 in the energizing circuit for relay coil K4-C will open to prevent energization of that relay coil. Conversely, had relay coil K4-C become energized, its normally closed relay contacts K4-2 in the energizing circuit for the relay coil K3-C would have opened to prevent energization of that relay coil.

It is assumed that relay coil K3-C has become energized and, consequently, all of its normally open contacts now become closed and its normally closed contacts become open. A logic circuit LC is interposed between the comparison circuits MC1 and MC2 and the GO, NO GO indicators 20 and 22. This logic circuit includes normally open K3-3 and K4-3 relay contacts. Energization of relay coil K3-C causes the relay contacts K3-3 to become closed to partially complete a circuit for energizing one of the indicator lamps 20 or 22. If, in the second portion of the test, relay coil K8-C becomes energized then its normally open contacts K8-4 in the logic circuit LC will become closed so that a circuit is completed from the B+ power supply source through the now closed relay contacts K3-3 to energize the reject lamp 22. This would be indicative that the voltages induced in windings 16 and 18 are out of phase. If, however, in the succeeding test portion it is relay coil K7-C that becomes energized, then its normally open contacts K7-3 in the logic circuit LC will become closed so that the accept lamp 20 is energized indicative that the windings have been connected properly.

Continuing in the description of operation, once relay coil K3-C becomes energized all of its normally open contacts become closed so that relay coil K5-C in the change-over circuit CO becomes energized. This relay serves to provide a change-over or transfer function for the second test operation during which winding 14 is energized and the voltage induced in coil 18 is sensed.

During the second portion of the test, relay coil K5-C is energized so that the start winding 14 is energized through the now closed, normally open relay contacts K5-2. Consequently, a voltage signal is induced in the sensing coil 18 and this signal is now applied through a set of normally open, but now closed, relay contacts K5-4 to be squared by the squaring circuit SC. As in the previous test procedure, the square wave output signal from the squaring circuit SC is displaced in phase by approximately 180° by the inverter amplifier I. The square wave signals from inverter amplifier I and the squaring circuit SC are respectively applied through normally open, but now closed, relay contacts K5-7 and K5-8 to one input each of respective AND gates 60 and 62 located in the start comparator circuit SC1 and the start comparator circuit SC2. As in the previous test portion, only the positive portions of these two square waves are applied to the AND gates 60 and 62 through respective diodes 64 and 66. The AND gates are enabled in synchronism with the positive half cycle of the alternating voltage source V by means of clock pulses applied from the clock pulse generator PG through diodes 68 and 70 to the respective second inputs of the AND gates 60 and 62. As shown in FIG. 3, the output circuit of AND gate 60 is taken through a diode 70, poled as shown, to a relay coil K8-C connected in series with a set of normally closed relay contacts K7-2 to ground. The junction point of relay coil K8-C and diode 70 is also connected to the B+ voltage supply source through a set of normally open relay contacts K8-1. Similarly, the output circuit of AND gate 62 is connected through a diode 72 to a relay coil K7-C connected in series with a set of normally closed relay contacts K8-2 to ground. The junction of diode 72 and relay K7-C is connected to the B+ voltage supply source through a set of normally open relay contacts K7-1.

As stated hereinbefore, if the second test portion results in energization of relay coil K7-C then the accept indicator 20 will become energized, whereas if relay coil K8-C is energized then the reject indicator 22 will become energized. Consequently, for an accept condition to prevail, relay coil K7-C must become energized, indicative that the positive portion of the square wave output signal from the squaring circuit SC is in phase with the clock signal obtained from the pulse generator PG. If so, then when AND gate 62 is enabled by a clock pulse a positive signal is also applied through diode 70 to the second input of the AND gate so that relay coil K7-C becomes energized. This will result in an accept indication at indicator 20. If, however, the windings are incorrect then the voltage induced in coil 18 would have been out of phase with that induced in winding 16. This would have resulted in relay coil K8-C becoming energized, causing energization of the reject indicator 22.

An accept condition may also be one in which the voltages at windings 12 and 14 are out of phase. In the description given thus far, an accept condition has been assumed as being one in which the voltages in the main winding 12 and start winding 14 are in phase. Consequently, switch S2 in the logic circuit LC has been positioned as shown in FIG. 3. If, however, an accept condition required that the voltages at windings 12 and 14 be out of phase, then switch S2 would be positioned to the opposite condition from that shown in FIG. 3. An accept condition would then require that relay coils K3-C and K8-C become energized or that relay coils K4-C and K7-C become energized.

Figure 4:
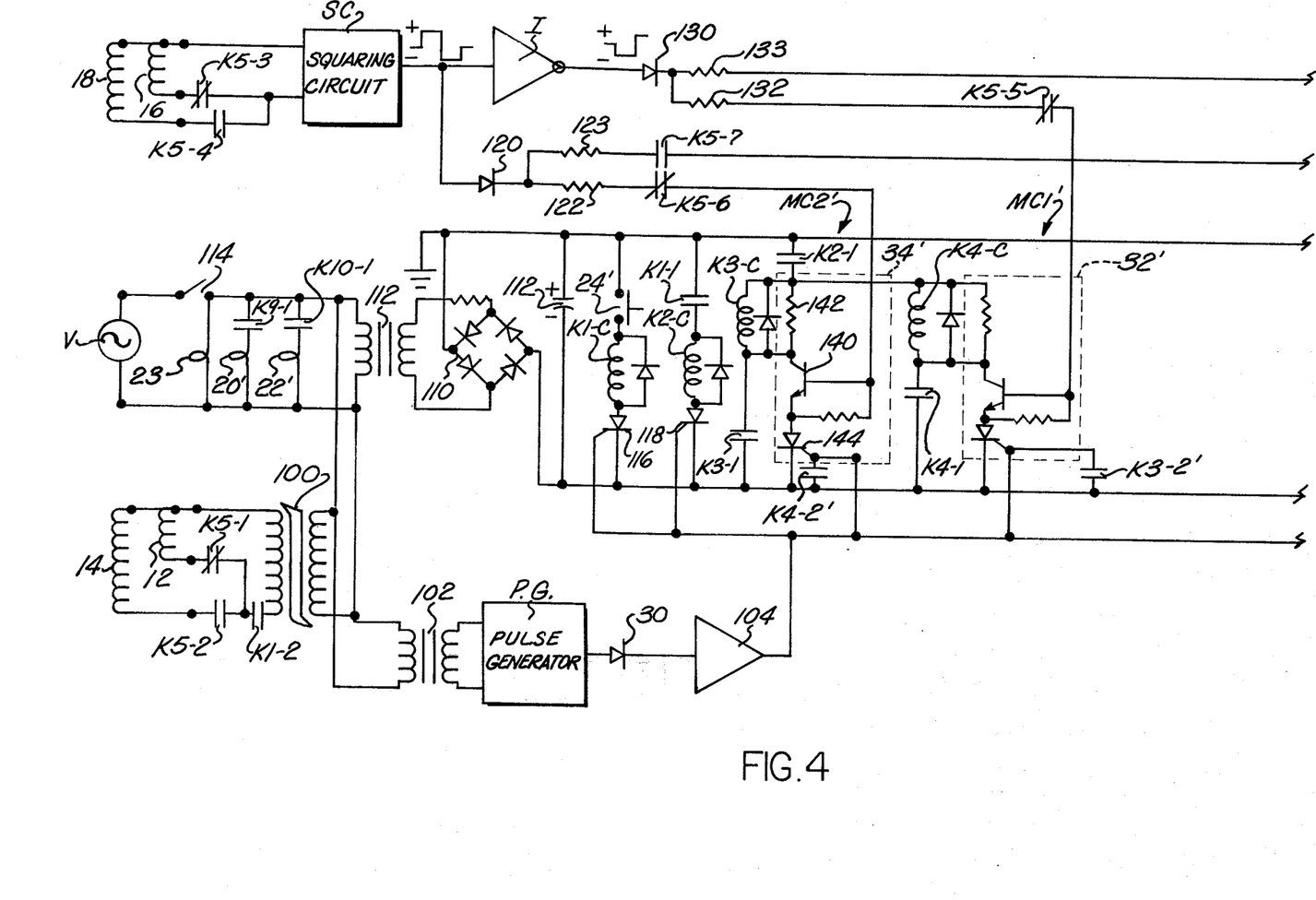

Reference is now made to FIG. 4 which illustrates a more detailed combined block diagram-schematic circuit of the preferred embodiment of the test circuit. The test circuit in FIG. 4 is quite similar to that shown in FIG. 3 and, hence, for purposes of simplification like components in both circuits are identified with like character references and those components which have been changed only slightly in FIG. 4 are referred to with a primed character reference. Also, only the differences in circuitry and operation will be described herein for purposes of simplifying the description of the invention.

Referring now to FIG. 4, test circuit TC' like test circuit TC serves to apply an alternating voltage test signal to either the main winding 12 or the start winding 14. After closure of switch 114 alternating voltage obtained from the voltage source V is applied to the main winding 12 through a saturating transformer 100, a set of normally open contacts K1-2 and normally closed relay contacts K5-1. Pulse generator PG is transformer coupled to the voltage source V through a transformer 102 and the pulse generator serves to provide clock pulses which are synchronized to the source. Only positive clock pulses are applied through diode 30 and these are amplified by a pulse amplifier 104 to provide the clock enabling signals for AND gates 32', 34', 60' and 62'.

The logic circuit LC' in FIG. 4 is essentially the same as logic circuit LC in FIG. 3 with the exception that indicator lights 20 and 22 are replaced by an accept relay coil K9-C and a reject relay coil K10-C. Relay K9-C has a set of normally open contacts K9-1 connected in series with an indicator lamp 20' across the alternating voltage source V. Similarly, the reject relay coil K10-C has a set of normally open contacts K10-1 connected in series with an indicator light 22' across the alternating voltage source V. Consequently, the major distinction here is that the indicator lamps 20' and 22' are energized by alternating current voltage rather than D.C. voltage. Another indicator lamp 23 is connected across voltage source V so that upon closure of switch 24', light 23 is energized to indicate that power has been applied to the test circuit TC'.

With switch 114 closed, a full wave rectifier 110, coupled to source V through a transformer 112, serves to provide operating D.C. power for the test circuit. A distinction here over that shown in FIG. 3 is that rectifier 110 provides ground and B− operating potential. If desired, the operating potential may be ground and B+ as shown in FIG. 3. A charged smoothing capacitor 113 is connected across the full wave rectifier circuit 110 to provide the B− and ground potentials to the test circuit TC'.

The test circuit TC' commences its operation function in response to closure of switch 24'. With this switch closed relay coil K1-C will become energized when its series connected silicon controlled rectifier, SCR, 116 is gated into conduction from a positive clock pulse provided by the pulse generator PG. This sets up a condition to energize relay coil K2-C through the now closed, but normally opened, relay contacts K1-1 once SCR 118 is gated into conduction. This will occur during the same half cycle of operation or during the next half cycle when relay coil K1-C is energized.

With relay coil K2-C energized, a condition is satisfied by closure of its normally open relay contacts K2-1 for comparator circuits MC1' and MC2' to perform the phase comparison functions in the same manner as described in detail with respect to FIG. 3. Thus, the positive half cycle of the square wave obtained from squaring circuit SC is passed through diode 120 and thence through a series resistor 122 and a set of normally closed relay contacts K5-6 to one input of AND gate 34' in the main comparing circuit MC2'. Similarly, the positive half cycle of the square wave signal obtained from the inverter amplifier I is passed by diode 130 through a series resistor 132 and a set of normally closed relay contacts K5-5 to one input of AND gate 32' in the second main winding comparator circuit MC1'.

The comparator circuits MC1' and MC2' operate in the same fashion as comparators MC1 and MC2 described previously with reference to FIG. 3. AND gates 32' and 34' perform the same functions as AND gates 32 and 34. AND gates 32', 34', 60' and 62' in the test circuit TC' are identical and consequently only AND gate 34' will be described herein in detail, it being understood that the other AND gates are constructed in the same fashion and operate in the same manner.

AND gate 34' includes a NPN transistor 140 having its collector connected through a resistor 142 and the now closed relay contacts K2-1 to ground. The emitter of transistor 140 is connected to the andoe of an SCR 144 with the cathode of the SCR being connected to the B− voltage supply source. The clock enabling signal for the AND gate is applied to the gate electrode of SCR 144 and when a positive signal is concurrently applied to the base of transistor 140, through normally closed relay contacts K5-5, the transistor will become conductive so that current flows through its collector to emitter path and through the enabled SCR 144. Relay coil K3-C is connected in parallel with resistor 142 and becomes energized once a circuit has been completed through SCR 144. Relay coil K3-C is locked up through its own holding circuit including relay contacts K3-1, in the same manner as described before with reference to FIG. 3.

A modification over the circuit shown in FIG. 3 is the omission in circuit MC2' of normally closed relay contacts K4-2 and the substitution therefor of a set of normally open relay contacts K4-2' connected between the B— voltage supply source and the gate of SCR 144. Similarly, circuit MC1' is provided with a set of normally open relay contacts K3-2' connected between gate electrode of the SCR in the AND gate and the B— voltage supply source. Relay contacts K3-2' and K4-2' serve essentially the same function as relay contacts K3-2 and K4-2 in FIG. 3. Thus, if the phase comparators operate such that relay coil K3-C becomes energized then its normally open contacts K3-2' close to prevent energization of relay coil K4-C. Similarly, if the comparators operate such that relay coil K4-C becomes energized, then its normally open contacts K4-2' operate to prevent energization of relay coil K3-C.

The change over circuit CO' of FIG. 4 is similar to that of the change over circuit CO described previously with reference to FIG. 3. However, an additional set of normally open relay contacts K5-9 is connected from the junction of relay contacts K4-4 and K3-4 to a relay coil K11-C. This relay becomes energized when SCR 160 is gated into conduction, as during the positive portion of the second cycle of alternating voltage from source V. Energization of relay coil K11-C serves essentially the same purpose as energization of relay coil K1-C in that its normally open contacts K11-1 become closed to energize relay coil K6-C through an SCR 162 during the same half cycle of operation or in the next positive half cycle that relay coil K11-C is energized. The transfer function is now complete since all of the normally open K5 relay contacts have become closed and all of the normally closed K5 contacts have become opened. Energization of relay coil K6-C causes its normally open relay contacts K6-1 to become closed to activate the start comparator circuits SC1' and SC2'.

The start comparator circuits SC1' and SC2' in FIG. 4 serve the same functions as circuits SC1 and SC2 described previously with reference to FIG. 3. AND gates 60' and 62' serve the same function as AND gates 60 and 62 of FIG. 3 and these gates are constructed and operate in the same manner as AND gate 34' previously described in detail. A modification made in circuit SC1' over circuit SC1 is the omission of normally closed relay contacts K7-2 and the inclusion in circuit SC1' of normally open contacts K7-2' connected between the B— voltage supply source and the gate of the SCR in AND gate 60'. Similarly, circuit SC2' omits normally closed relay contacts K8-2 and includes a set of normally open relay contacts K8-2' connected between the B— voltage supply source and the gate of the SCR in AND gate 62'. Relay contacts K7-2' and K8-2' serve essentially the same function as relay contacts K7-2 and K8-2 in FIG. 3. Thus, upon energization of relay coil K7-C in circuit TC' its normally open contacts K7-2' become closed to prevent energization of relay coil K8-C. Similarly, if relay coil K8-C had become energized then its normally open relay contacts K8-2' would have become closed to prevent energization of relay coil K7-C. The operation of comparator circuits SC2' is essentially the same as that of circuits SC1 and SC2 and, hence, no detailed description of this operation is deemed necessary for complete understanding by one skilled in the art. During the operation, the positive portion of the output signal from the squaring circuit SC is applied through diode 120 and thence through a resistor 123 and the now closed relay contacts K5-7 to one input of the AND gate 62' in circuit SC2'. Similarly, the positive output from the inverter amplifier I is applied through diode 130 and thence through a resistor 133 and the now closed relay contacts K5-8 to one input of AND gate 60' in circuit SC1'.

In summary, the invention has been described herein with respect to a preferred embodiment as shown in the simplified circuitry of FIG. 3 or in the more detailed circuitry of FIG. 4. The disclosed test circuit serves to provide a relatively simple readout or indication of whether a pair of windings in a motor or the like have been properly connected to obtain a desired direction of motor rotation. With respect to this specific embodiment, a time varying test signal obtained from an alternating voltage source is applied to the main and start windings to produce first and second varying magnetic fields. These fields are sensed, as with sensing coils 16 and 18, for purposes of developing first and second output signals which vary in magnitude and direction with the magnetic fields developed at the main winding 12 and start winding 14. A pair of output signals is obtained from the squaring circuit SC in the inverting circuit I for each signal sensed by coils 16 and 18. The control signals of each pair are displaced in phase by substantially 180°. A third signal in the form of clock pulse, developed by a pulse generator PG, is provided having a known phase relationship with respect to the test signal. The two pairs of control signals obtained from the squaring circuit and the inverting circuit for each of the signals sensed by coils 16 and 18 are compared with the clock pulse signal by means of the four comparator circuits. Depending on results of the comparison the logic circuit, LC or LC', serves to actuate an indicator representative that the magnetic field at windings 12 and 14 are either in phase or out of phase.

Whereas the invention has been described with respect to a preferred embodiment, it is to be appreciated that the invention is not limited thereto as various modifications in components and methods may be made without departing from the spirit and scope of the invention as defined by the appended claims.

What is claimed is:

1. A method of testing motor stator windings prior to final motor assembly for proper winding connections of at least first and second windings to obtain a given motor direction and comprising the steps of applying alternating voltage to said windings to respectively produce first and second magnetic fields, electrically sensing each of said magnetic fields and electrically determining whether each field has a first phase relationship or a second phase relationship with respect to said alternating voltage and independently of the relative magnitudes of said fields and said alternating voltage, and providing an output indication of whether the winding connections are proper or not dependent upon said phase relationships.

2. Apparatus for testing first and second windings of an electrical motor to determine if the windings have been properly assembled for a given motor direction and comprising means for applying a time varying energizing signal to said windings to produce varying magnetic fields at said windings, means for electrically determining the phase relationship of said magnetic fields independently of the relative magnitudes of said magnetic fields, and indicator means for providing an output representation of whether said windings have been properly assembled to obtain said given motor direction dependent upon said magnetic field phase relationship.

3. Apparatus as set forth in claim 2, wherein said phase relationship determining means includes magnetic field sensing means for sensing each said magnetic field and developing an output signal exhibiting a characteristic representative of the polarity or direction of the sensed magnetic field.

4. Apparatus as set forth in claim 2, wherein said indicator means includes at least one lamp adapted for energization to provide a visual indication dependent upon said magnetic field phase relationship.

5. Apparatus as set forth in claim 2, wherein said indicator means includes first and second winding condition indicating means for respectively providing indications of accept and reject conditions in dependence upon said magnetic field relationship.

6. Apparatus as set forth in claim 2, wherein said phase relationship determining means includes means for determining whether said magnetic fields are respectively in phase or out of phase.

7. Apparatus as set forth in claim 6, wherein said indicator means includes first and second condition indicating means for respectively indicating first and second conditions of said windings and logic circuit means interposed between said determining means and said indicator means for controlling energization of said first and second condition indicating means in dependence upon whether said fields are in phase out of phase.

8. Apparatus for testing first and second windings of an electrical motor to determine if the windings have been properly assembled for a given motor direction and comprising means for applying a time varying energizing signal to said windings to produce varying magnetic fields at said windings, means for electrically determining the phase relationship of said magnetic fields, indicator means for providing an output representation of whether said windings have been properly assembled to obtain said given motor direction dependent upon said magnetic field phase relationship, said indicator means includes first and second condition indicating means for respectively indicating first and second conditions of said windings and logic circuit means interposed between said determining means and said indicator means for controlling energization of said first and second condition indicating means in dependence upon whether said fields are in phase or out of phase, and programmable switching means interposed between said logic means and said indicator means so that either one of said condition indicator means may be selected to be energized for either one of said phase conditions.

9. Apparatus as set forth in claim 8, wherein said first and second condition indicating means includes a winding accept lamp and a winding reject lamp for respectively indicating accept and reject winding conditions, said programmable switching means being actuatable for associating either one of said lamps with either an in phase condition or an out of phase condition of said windings.

10. Apparatus as set forth in claim 2 including test change over circuit means having first and second conditions for respectively controlling application of a said time varying signal to one of said windings and then to the other of said windings, said phase determining means including first phase determining circuit means operable during said first condition for determining whether the magnetic field produced at said first winding exhibits a first or second phase relationship with respect to said energizing signal and second phase determining circuit means operable during said second condition for determining whether the magnetic field produced at said second winding exhibits a first or second phase relationship with respect to said energizing signal.

11. Apparatus for testing a winding and comprising: means for applying a time varying energizing signal to said winding to produce a varying magnetic field; and means for electrically determining whether said magnetic field is in phase or out of phase with said energizing signal and including means for developing a control signal having a fixed phase relationship to said magnetic field, circuit means for providing a reference signal synchronized to said energizing signal, and phase comparator circuit means for electrically determining the phase relationship between said reference signal and said control signal independently of the relative magnitudes of said reference signal and said control signal.

12. Apparatus as set forth in claim 11 including indicator means for providing an indication of said phase relationship determination.

13. Apparatus as set forth in claim 12, wherein said indicator means includes light means for providing a visual indication of said determination.

14. Apparatus for testing first and second windings for electrically determining the relative phase relationship of the magnetic fields produced at said respective windings when said windings are energized by application of voltage thereto, and comprising means for applying energizing voltage to said first and second windings to respectively produce first and second magnetic fields, first and second magnetic field sensing means positioned to respectively sense said first and second magnetic fields and provide first and second output signals respectively representative of the phases of said first and second magnetic fields, and circuit means for providing an output indication representative of the relative phase relationship of said first and second fields in dependence upon the phase relationship of said first and second output signals and independent of the relative magnitudes of said first and second output signals.

15. Apparatus as set forth in claim 14, wherein each said first and second magnetic field sensing means includes coil means to be positioned within one of said magnetic fields so as to provide an output signal in accordance therewith.

16. Apparatus as set forth in claim 14, wherein said circuit means includes comparator means for comparing said first and second output signals to determine the relative phase relationship of the magnetic fields represented thereby.

17. A method of electrically testing a winding for determining the magnetic field phase relationship thereof with respect to an applied magnetic field producing signal and comprising the steps of:

applying a time varying current input signal to a said winding so as to produce a varying magnetic field, developing an output signal from said magnetic field so that said output signal varies in magnitude and direction with that of said field, developing first and second phase displaced signals with said first signal being substantially in phase with said output signal and said second signal being substantially 180° out of phase with said output signal, developing a third signal substantially in phase with said input signal; and comparing the phase relationship of said first and second signals with said third signal for providing an output indication of the phase relationship between said input signal and said output signal in dependence upon said comparison.

18. A method as set forth in claim 17, wherein said step of applying said input signal comprises applying an alternating current signal of a relatively constant frequency from an alternating current voltage source to said winding so that the magnetic field produced thereby alternately collapses and expands in dependence upon said frequency and that said output signal varies as said field varies.

19. A method as set forth in claim 18, wherein said step of developing said third signal comprises developing a said third signal synchronized with that of said voltage source.

20. A method of electrically determining the relative phase relationship of variable magnetic fields produced at first and second windings and comprising the steps of:

applying a time varying test signal to said first and second windings to produce first and second varying magnetic fields;

developing first and second output signals from said respective magnetic fields so that said output signals respectively vary in magnitude and direction with said first and second magnetic fields;

for each of said first and second output signals, developing first and second pairs of control signals with each pair being displaced in phase by substantially 180° with one of said control signals of each pair having a given phase relationship to the associated output signal, providing a third signal having a known phase relationship with respect to said test signal; and comparing said first and second pairs of control signals with said third signal for providing an output indication of the phase relationship of said first and second magnetic fields in dependence upon said comparison.

21. A method as set forth in claim 20, wherein said step of applying a time varying test signal comprises applying current signals from an alternating current voltage source and wherein said third signal is in synchronism with said voltage source.

* * * * *